(12) United States Patent
Hashimoto et al.

(10) Patent No.: US 9,786,726 B2
(45) Date of Patent: Oct. 10, 2017

(54) ORGANIC LIGHT-EMITTING DEVICE AND ORGANIC DISPLAY DEVICE

(71) Applicant: JOLED INC., Tokyo (JP)

(72) Inventors: Jun Hashimoto, Tokyo (JP); Hideyuki Shirahase, Tokyo (JP); Kenichi Nendai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/117,546

(22) PCT Filed: Feb. 13, 2015

(86) PCT No.: PCT/JP2015/000676
§ 371 (c)(1),
(2) Date: Aug. 9, 2016

(87) PCT Pub. No.: WO2015/125448
PCT Pub. Date: Aug. 27, 2015

(65) Prior Publication Data
US 2016/0351637 A1    Dec. 1, 2016

(30) Foreign Application Priority Data
Feb. 21, 2014  (JP) ................ 2014-031299

(51) Int. Cl.
*H01L 27/32*  (2006.01)
*H01L 51/50*  (2006.01)
(Continued)

(52) U.S. Cl.
CPC ........ *H01L 27/3246* (2013.01); *H01L 27/322* (2013.01); *H01L 51/0096* (2013.01);
(Continued)

(58) Field of Classification Search
CPC ............... H01L 27/3246; H01L 27/322; H01L 51/0096; H01L 51/5056; H01L 51/5076;
(Continued)

(56) References Cited

U.S. PATENT DOCUMENTS 5,443,922 A  8/1995  Nishizaki et al.
6,589,673 B1  7/2003  Kido et al.
(Continued)

FOREIGN PATENT DOCUMENTS

JP  05-163488  6/1993
JP  2001-102175  4/2001
(Continued)

OTHER PUBLICATIONS

Search Report issued by Japan patent office in International Patent Application No. PCT/JP2015/000676, dated Apr. 14, 2015.

*Primary Examiner* — Fernando L Toledo
*Assistant Examiner* — Neil Prasad
(74) *Attorney, Agent, or Firm* — Greenblum & Bernstein, P.L.C.

(57) ABSTRACT

Light emitters are two-dimensionally disposed along a main surface of the substrate. The light emitters each include: a first electrode; an organic light-emitting layer; an intermediate layer; a charge transport layer; and a second electrode. Such layers are disposed in the stated order with the first electrode closest to the substrate. The intermediate layer contains a fluoride of an alkali metal or a fluoride of an alkaline earth metal. The charge transport layer contains an organic material doped with an alkali metal or an alkaline earth metal. The light emitters are partitioned from one another by first banks extending in one direction along the main surface of the substrate and second banks extending in a direction intersecting the one direction. Surface portions of the first banks facing the light emitters have greater liquid
(Continued)

repellency than surface portions of the second banks facing the light emitters.

12 Claims, 11 Drawing Sheets

(51) Int. Cl.
    *H01L 51/00*     (2006.01)
    *H01L 51/52*     (2006.01)

(52) U.S. Cl.
    CPC ...... *H01L 51/5056* (2013.01); *H01L 51/5076* (2013.01); *H01L 51/5088* (2013.01); *H01L 51/5092* (2013.01); *H01L 51/5234* (2013.01)

(58) Field of Classification Search
    CPC ............. H01L 51/5088; H01L 51/5092; H01L 51/5234
    See application file for complete search history.

(56) References Cited

U.S. PATENT DOCUMENTS

| | | | |
|---|---|---|---|
| 2007/0066179 | A1 | 3/2007 | Nakamura et al. |
| 2007/0210705 | A1 | 9/2007 | Yokoi et al. |
| 2009/0160322 | A1 | 6/2009 | Yoshida et al. |
| 2014/0131692 | A1* | 5/2014 | Mishima ............. H01L 51/5088 257/40 |
| 2014/0151681 | A1 | 6/2014 | Iwasaki |
| 2014/0159031 | A1* | 6/2014 | Aonuma ................. H01L 51/56 257/40 |

FOREIGN PATENT DOCUMENTS

| | | |
|---|---|---|
| JP | 2007-087785 | 4/2007 |
| JP | 2007-095521 | 4/2007 |
| JP | 2009-200049 | 9/2009 |
| JP | 4882508 | 12/2011 |
| JP | 2013-033872 | 2/2013 |
| JP | 2013-074085 | 4/2013 |
| JP | 2013-077430 | 4/2013 |

\* cited by examiner

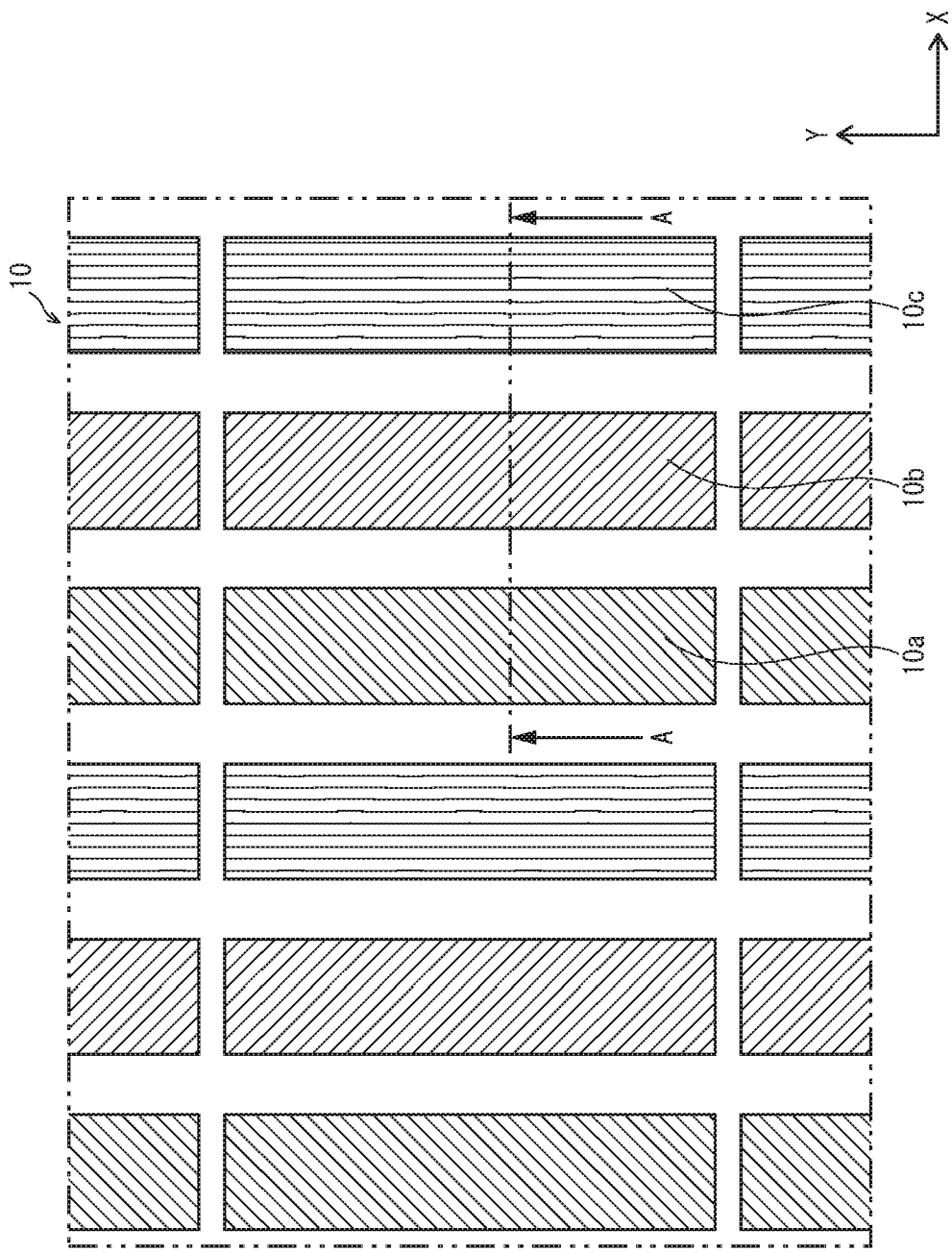

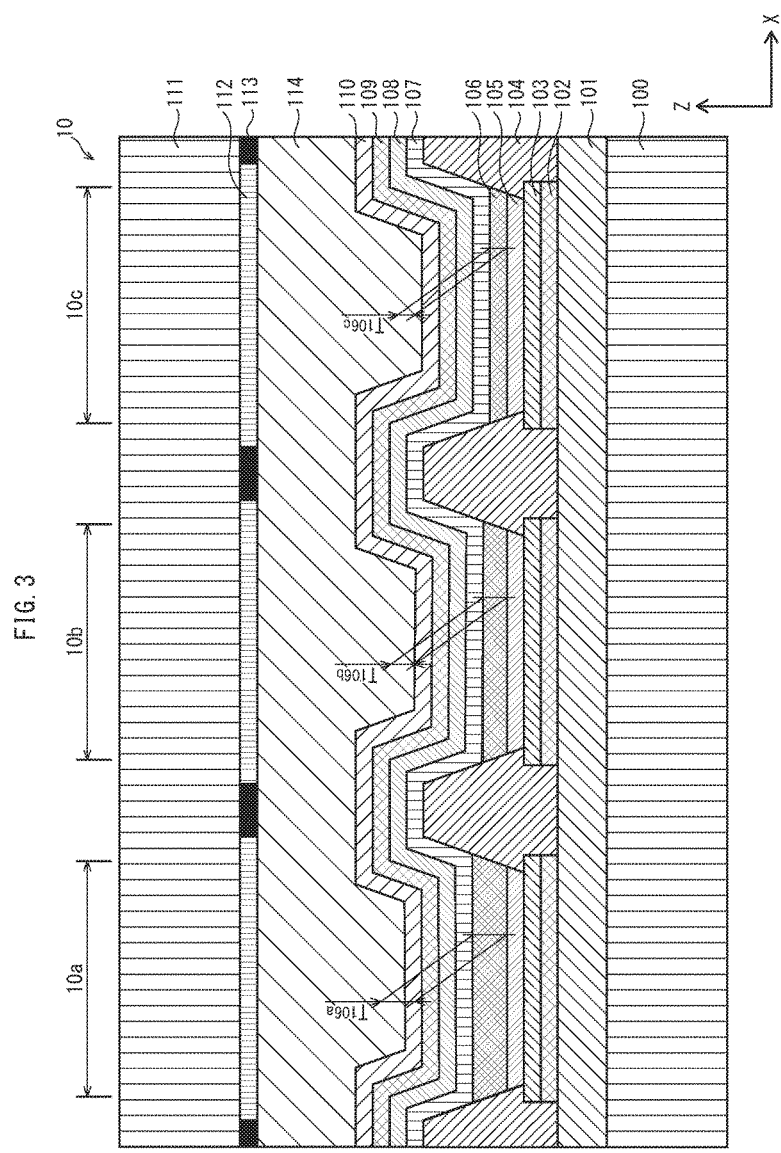

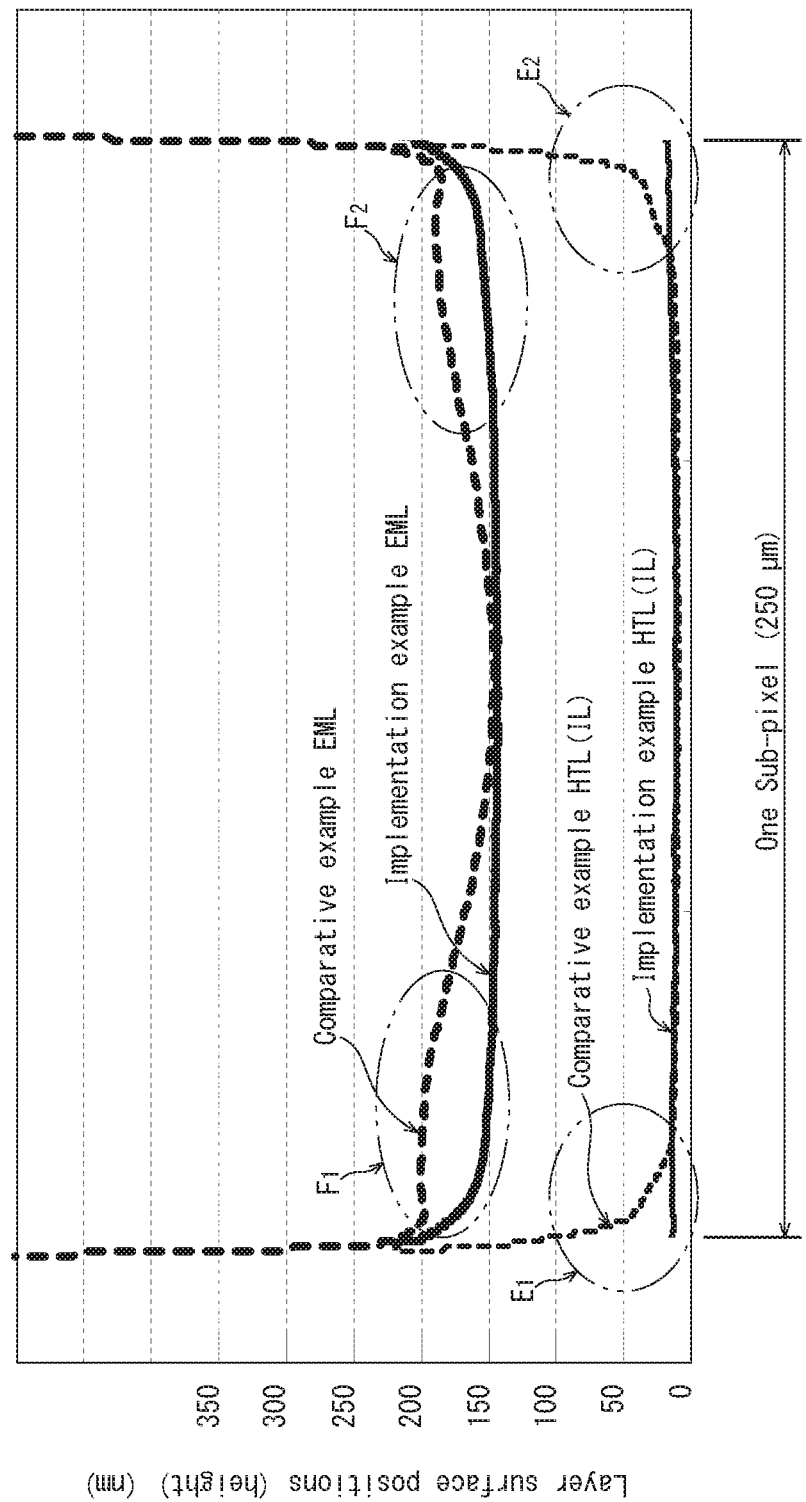

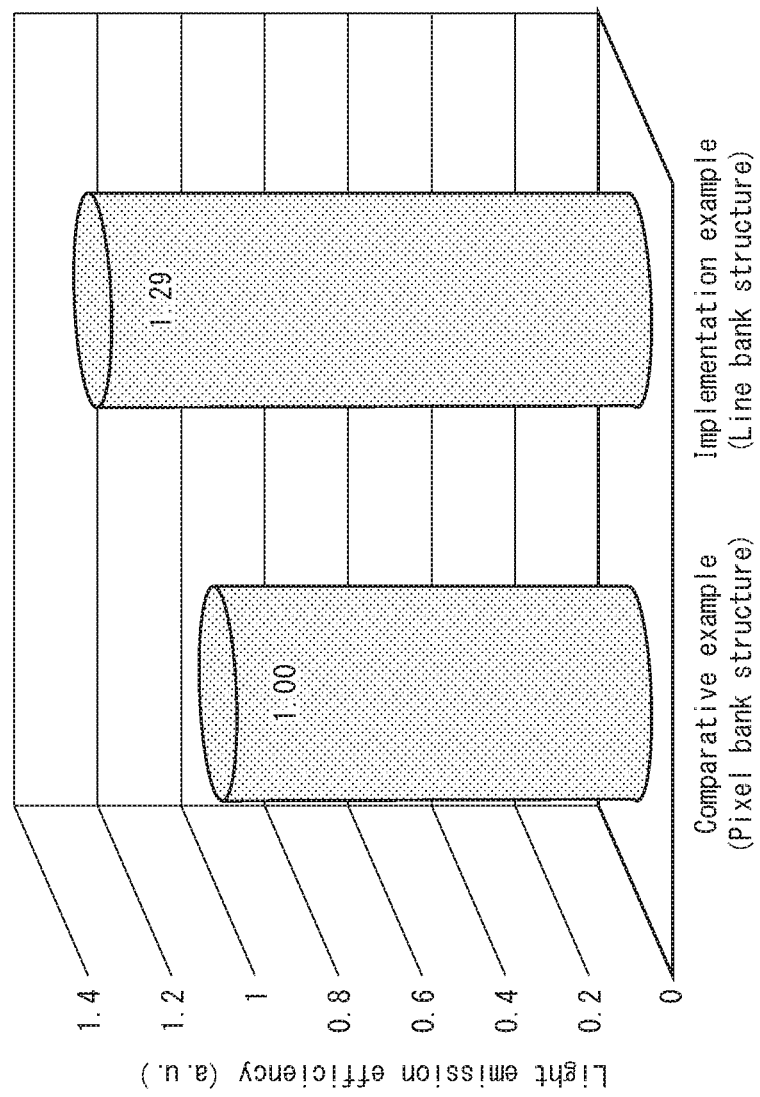

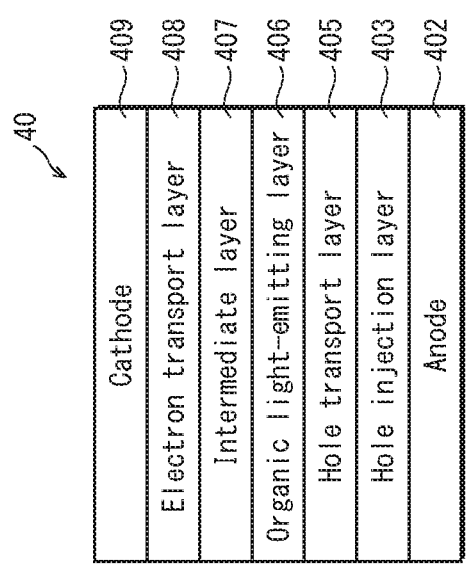

ORGANIC LIGHT-EMITTING DEVICE AND ORGANIC DISPLAY DEVICE

TECHNICAL FIELD

The present invention pertains to an organic light-emitting device and to an organic display device. In particular, the present invention relates to a bank structure in a device having a plurality of light emitters each including a charge transport layer containing an organic material doped with an alkali metal or an alkaline earth metal.

BACKGROUND ART

In recent years, the development of organic light-emitting devices, such as organic electroluminescence (EL) panels and organic EL lighting apparatuses, has flourished.

A typical organic EL panel includes a substrate and sub-pixels that are arranged two-dimensionally along a main surface of the substrate. In each sub-pixel, an anode, a hole injection layer, a hole transport layer, an organic light-emitting layer, an electron transport layer, and a cathode are disposed over the substrate in the stated order.

Also, a typical organic EL panel includes banks partitioning neighboring sub-pixels in the forming of organic layers such as an organic light-emitting layer. The banks are formed by using an electrically-insulative material, and surface portions of the banks have liquid repellency.

Meanwhile, research and development are underway of using a layer formed by using an organic material doped with barium, for example, as an electron transport layer. Such an electron transport layer achieves high electron injection characteristics.

However, such an electron transport layer readily undergoes degradation when affected by undesirable substances (e.g., water and oxygen). In view of this, a technology has been developed of disposing a barrier layer formed by using an inorganic material between an organic light-emitting layer and an electron transport layer (see Patent Literature 1). Further, Patent Literature 1 discloses silicon oxide ($SiO_x$) and the like as inorganic material usable for forming such a barrier layer.

CITATION LIST

Patent Literature

[Patent Literature 1]
Japanese Patent Publication No. 4882508

SUMMARY OF INVENTION

Technical Problem

However, a decrease in light emission efficiency is expected to occur when disposing the barrier layer disclosed in Patent Literature 1, which is formed by using an inorganic material, between an organic light-emitting layer and an electron transport layer. This decrease in light emission efficiency is considered to occur due to the inorganic material disclosed in Patent Literature 1 having low electron injection characteristics, and thus the barrier layer becoming an obstacle impeding the injection of electrons into the organic light-emitting layer.

In order to prevent such decrease in electron injection characteristics brought about by the inclusion of such a barrier layer, development is in progress of a structure where the electron transport layer contains an organic material doped with an alkali metal or an alkaline earth metal, and an intermediate layer containing a fluoride of an alkali metal or an alkaline earth metal is disposed between the electron transport layer and the organic light-emitting layer.

Such an intermediate layer is expected to achieve both the function of blocking undesirable substances and high electron injection characteristics.

Meanwhile, there is a demand for organic light-emitting devices, a typical example of which is an organic EL panel, that have even higher light emission efficiency than conventional organic light-emitting devices.

The present invention aims to provide an organic light-emitting device and an organic display device that have even higher light emission efficiency than conventional devices, for including a charge transport layer having high quality due to not being affected by undesirable substances and for achieving high charge injection characteristics.

Solution to Problem

One aspect of the present invention is an organic light-emitting device including: a substrate; and light emitters two-dimensionally disposed along a main surface of the substrate. The light emitters each include, along a first direction intersecting the main surface of the substrate: a first electrode; an organic light-emitting layer; an intermediate layer; a charge transport layer; and a second electrode.

The first electrode is disposed on or above the substrate.

The organic light-emitting layer is disposed on or above the first electrode. That is, the first electrode and the organic light-emitting layer may be in contact with one another. Alternatively, another functional layer may be disposed between the first electrode and organic light-emitting layer.

The intermediate layer is disposed on or above the organic light-emitting layer. That is, the organic light-emitting layer and the intermediate layer may be in contact with one another. Alternatively, another functional layer may be disposed between the organic light-emitting layer and the intermediate layer.

The charge transport layer is disposed on the intermediate layer.

The second electrode is disposed on or above the charge transport layer. That is, the charge transport layer and the second electrode may be in contact with one another. Alternatively, another functional layer may be disposed between the charge transport layer and the second electrode.

The intermediate layer contains a fluoride of an alkali metal or a fluoride of an alkaline earth metal, and the charge transport layer contains an organic material doped with an alkali metal or an alkaline earth metal.

Further, the organic light-emitting device pertaining to one aspect of the present invention further includes: first banks partitioning the light emitters from one another along a second direction that is one direction along the main surface of the substrate, and extending in a third direction that is one direction along the main surface of the substrate and that intersects the second direction; and second banks partitioning the light emitters from one another along the third direction, and extending in the second direction, and the first banks and the second banks each contain an electrically-insulative material, and surface portions of the first banks facing the light emitters have greater liquid repellency than surface portions of the second banks facing the light emitters.

Advantageous Effects of Invention

The organic light-emitting device pertaining to one aspect of the present invention has even higher light emission efficiency than conventional devices, for including a charge transport layer having high quality due to not being affected by undesirable substances and for achieving high charge injection characteristics.

BRIEF DESCRIPTION OF DRAWINGS

FIG. 2 is a schematic plan view diagram illustrating the arrangement of sub-pixels 10a, 10b, and 10c in a display panel 10.

FIG. 3 is a schematic cross-sectional diagram illustrating the configuration along a cross-section A-A of FIG. 2.

FIG. 6 is a schematic diagram illustrating surface shapes of an organic light-emitting layer and a hole transport layer with a bank structure pertaining to an implementation example.

FIG. 7 is a diagram comparing the implementation example and the comparative example in terms of light emission efficiency.

FIG. 11A is a schematic block diagram illustrating the configuration of layers in each sub-pixel of a display panel 40 pertaining to modification 1, and FIG. 11B is a schematic block diagram illustrating the configuration of layers in each sub-pixel of a display panel 50 pertaining to modification 2.

DESCRIPTION OF EMBODIMENTS

Aspects of Present Invention

Figure 1:
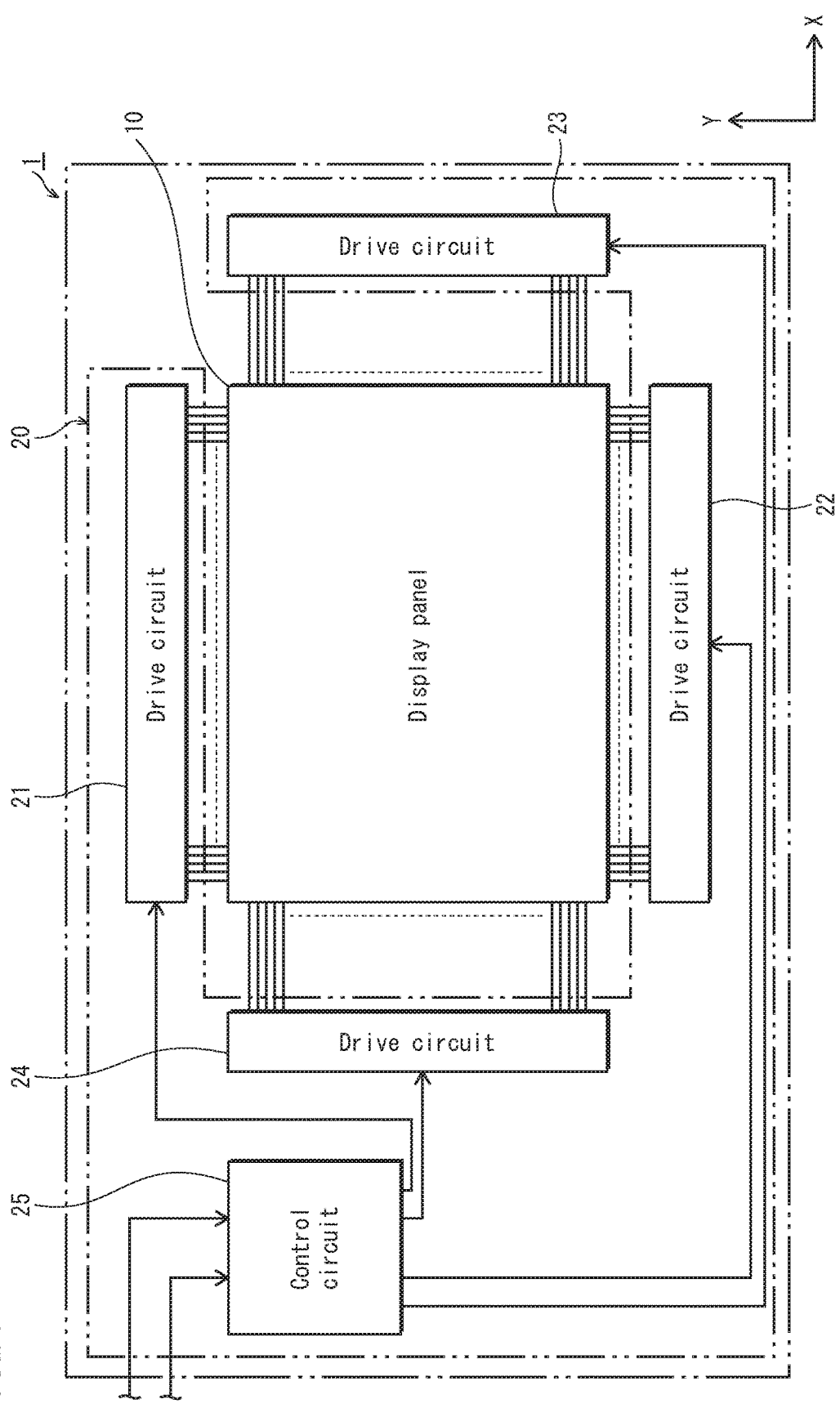
FIG. 1 is a schematic block diagram illustrating the overall configuration of an organic EL display device 1 pertaining to Embodiment 1 of the present invention.

One aspect of the present invention is an organic light-emitting device including: a substrate; and light emitters two-dimensionally disposed along a main surface of the substrate. The light emitters each include, along a first direction intersecting the main surface of the substrate: a first electrode; an organic light-emitting layer; an intermediate layer; a charge transport layer; and a second electrode.

The first electrode is disposed on or above the substrate.

The organic light-emitting layer is disposed on or above the first electrode. That is, the first electrode and the organic light-emitting layer may be in contact with one another. Alternatively, another functional layer may be disposed between the first electrode and organic light-emitting layer.

The intermediate layer is disposed on or above the organic light-emitting layer. That is, the organic light-emitting layer and the intermediate layer may be in contact with one another. Alternatively, another functional layer may be disposed between the organic light-emitting layer and the intermediate layer.

The charge transport layer is disposed on the intermediate layer.

The second electrode is disposed on or above the charge transport layer. That is, the charge transport layer and the second electrode may be in contact with one another. Alternatively, another functional layer may be disposed between the charge transport layer and the second electrode.

The intermediate layer contains a fluoride of an alkali metal or a fluoride of an alkaline earth metal, and the charge transport layer contains an organic material doped with an alkali metal or an alkaline earth metal.

Further, the organic light-emitting device pertaining to one aspect of the present invention further includes: first banks partitioning the light emitters from one another along a second direction that is one direction along the main surface of the substrate, and extending in a third direction that is one direction along the main surface of the substrate and that intersects the second direction; and second banks partitioning the light emitters from one another along the third direction, and extending in the second direction, and the first banks and the second banks each contain an electrically-insulative material, and surface portions of the first banks facing the light emitters have greater liquid repellency than surface portions of the second banks facing the light emitters.

The charge transport layer in the organic light-emitting device pertaining to one aspect of the present invention contains an organic material doped with an alkali metal or an alkaline earth metal. Thus, the organic light-emitting device pertaining to one aspect of the present invention achieves high light emission efficiency.

In addition, the intermediate layer in the organic light-emitting device pertaining to one aspect of the present invention, which is disposed between the organic light-emitting layer and the charge transport layer, contains a fluoride of an alkali metal or a fluoride of an alkaline earth metal. Thus, the intermediate layer blocks undesirable substances to a great extent. Accordingly, in the organic light-emitting device pertaining to one aspect of the present invention, undesirable substances deriving from the organic light-emitting layer are effectively prevented from penetrating into the charge transport layer. Thus, in the organic light-emitting device pertaining to one aspect of the present invention, the charge transport layer maintains its quality for not undergoing degradation and thus, the organic light-emitting device pertaining to one aspect of the present invention maintains high charge injection characteristics over a long period of time.

In addition, in the organic light-emitting device pertaining to one aspect of the present disclosure, surface portions of the first banks facing the light emitters have greater liquid repellency than surface portions of the second banks facing the light emitters. This difference in liquid repellency contributes to organic layers, a typical example of which is the organic light-emitting layer, having high flatness at surface portions thereof and a higher level of uniformity in terms of thickness along the third direction. Thus, the organic light-emitting device pertaining to one aspect of the present invention achieves high light emission efficiency.

As such, the organic light-emitting device pertaining to one aspect of the present invention has even higher light emission efficiency than conventional devices, for including a charge transport layer having high quality due to not being affected by undesirable substances and for achieving high charge injection characteristics.

In the organic light-emitting device pertaining to one aspect of the present invention, along the first direction, a height of the first banks is greater than a height of the second banks. With this structure, within each area defined by the first and second banks, layers such as the organic light-emitting layer have an even higher level of uniformity in terms of thickness. Thus, with this structure, the organic light-emitting device pertaining to one aspect of the present invention achieves even higher light emission efficiency.

The organic light-emitting device pertaining to one aspect of the present invention further includes an electrically-insulating layer disposed between the substrate and the first electrode, and in the organic light-emitting device pertaining to one aspect of the present invention, the height of the first banks and the height of the second banks are heights from a top surface of the electrically-insulating layer. With this structure, the height of the first banks is greater than the height of the second banks, relative to the top surface of the electrically-insulating layer (i.e., one main surface of the electrically-insulating layer that does not face the substrate). Thus, with this structure, the organic light-emitting device pertaining to one aspect of the present invention more certainly achieves high light emission efficiency.

In the organic light-emitting device pertaining to one aspect of the present invention, at intersections of the first banks and the second banks, the first banks are on the second banks. This means that the first banks and the second banks are not formed integrally, but instead are formed as separate components. Nevertheless, as long as surface portions of the first banks and surface portions of the second banks have different levels of liquid repellency as described above, the first banks and the second banks may be formed by using the same material or by using different materials.

In the organic light-emitting device pertaining to one aspect of the present invention, along the first direction, the height of the second banks is 40% to 70% the height of the first banks. Regarding this, the present inventors have confirmed that it is beneficial to define the ratio between the height of the first banks and the height of the second banks along the first direction as described above in order to achieve uniformity of organic layers in terms of thickness. Thus, with this structure, the organic light-emitting device pertaining to one aspect of the present invention achieves even higher light emission efficiency.

In the organic light-emitting device pertaining to one aspect of the present invention, $0.20L_P \leq W_{2B} \leq 0.30L_P$ holds true, where $L_P$ denotes a length along the third direction of each of the light emitters in a plan view of said each of the light emitters from the first direction, and $W_{2B}$ denotes a width along the third direction of each of the second banks in a plan view of said each of the second banks from the first direction. With this structure, the uniformity of the light emitters in terms of area and the uniformity of organic layers in terms of thickness can be accurately increased. Thus, with this structure, the organic light-emitting device pertaining to one aspect of the present invention achieves even higher light emission efficiency.

In the organic light-emitting device pertaining to one aspect of the present invention, $0.20L_P \leq W_{2B} \leq 0.25L_P$ holds true, where $L_P$ denotes a length along the third direction of each of the light emitters in a plan view of said each of the light emitters from the first direction, and $W_{2B}$ denotes a width along the third direction of each of the second banks in a plan view of said each of the second banks from the first direction. With this structure, the organic light-emitting device pertaining to one aspect of the present invention achieves even higher light emission efficiency.

In the organic light-emitting device pertaining to one aspect of the present invention, the first banks and the second banks are formed integrally. Thus, due to surface portions of the first banks and surface portions of the second banks have different levels of liquid repellency as described above, the organic light-emitting device pertaining to one aspect of the present invention achieves high light emission efficiency even with a so-called pixel bank structure.

In the organic light-emitting device pertaining to one aspect of the present invention, along the first direction, a height of the first banks is equal to a height of the second banks. Alternatively, the height of the first banks may differ from the height of the second banks. Here, the use of the expression "equal to" should not be construed as limiting to a situation where the first banks and the second banks have completely the same height. That is, the expression "equal to" shall be construed as encompassing tolerance for differences due to manufacturing variations and the like.

In the organic light-emitting device pertaining to one aspect of the present invention, the surface portions of the first banks facing the light emitters have greater liquid repellency than the surface portions of the second banks facing the light emitters, with respect to ink for the organic light-emitting layer. With this structure, the organic light-emitting device pertaining to one aspect of the present invention more certainly achieves high light emission efficiency.

In the organic light-emitting device pertaining to one aspect of the present invention, the intermediate layer contains a fluoride of sodium, and the charge transport layer contains an organic material doped with barium. Using these specific materials prevents degradation of the charge transport layer and achieves high light emission efficiency.

One aspect of the present invention is an organic display device including: a display panel; and a control/drive circuit connected to the display panel. The display panel in the organic display device pertaining to one aspect of the present invention has the structure of the organic light-emitting device pertaining to one aspect of the present invention, with any of the structures described above. Due to this, the organic display device pertaining to one aspect of the present invention achieves effects similar to the effects described above.

Embodiment 1

1. Overall Configuration of Organic EL Display Device 1

The overall configuration of an organic EL display device 1 pertaining to Embodiment 1 of the present invention is described with reference to FIGS. 1 and 2.

As illustrated in FIG. 1, the organic EL display device 1 includes a display panel 10 and a drive/control circuit unit 20 connected to the display panel 10. The display panel 10 is an organic EL panel employing the electroluminescence effect of organic material, and has a plurality of pixels.

As illustrated in FIG. 2, each pixel of the display panel 10 is made up of a sub-pixel 10a that is a light emitter of the color red (R), a sub-pixel 10b that is a light emitter of the color green (G), and a sub-pixel 10c that is a light emitter of the color blue (B). In the present Embodiment, the sub-pixels 10a, 10b, and 10c are arranged along the X axis and the Y axis to form a matrix (i.e., the sub-pixels are two-dimensionally disposed).

Returning to FIG. 1, the drive/control circuit unit 20 is made up of four drive circuits, namely drive circuits 21, 22, 23, and 24, and a control circuit 25.

In the organic EL display device 1, the display panel 10 and the drive/control circuit unit 20 need not be arranged with respect to one another in the arrangement illustrated in FIG. 1.

Further, FIG. 2 illustrates each pixel of the display panel 10 being composed of sub-pixels (light emitters) of the three colors R, G, and B. Alternatively, each pixel may be composed of light emitters of four or more colors.

2. Configuration of Display Panel 10

The configuration of the display panel 10 is described with reference to FIG. 3. The present Embodiment describes an example where the display panel 10 is a top-emission-type organic EL panel.

As illustrated in FIG. 3, the display panel 10 has a thin film transistor (TFT) substrate 100 serving as a base, and an electrically-insulative layer 101 is disposed on the top surface of the TFT substrate 100. The electrically-insulative layer 101 is formed so that a Z-axis-direction top surface thereof is substantially flat. The TFT substrate 100 includes TFT layers, which are not illustrated in FIG. 3 and other drawings to simplify the drawings.

Anodes 102 and hole injection layers 103 are disposed in the stated order over the Z-axis-direction top surface of the electrically-insulative layer 101. A combination of one anode 102 and one hole injection layer 103 is formed for each of the sub-pixels 10a, 10b, and 10c. However, a hole injection layer 103 that is continuous across the sub-pixels 10a, 10b, and 10c may be disposed.

First banks 104 are disposed over the top surface of the electrically-insulative layer 101, covering X-axis-direction end portions of the hole injection layers 103. Specifically, each first bank 104 is disposed between two adjacent sub-pixels along the X-axis direction. Further, along the X-axis direction, the first banks 104 define a plurality of apertures each corresponding to one light emitting region.

Within each aperture defined by adjacent first banks 104, a hole transport layer 105 and an organic light-emitting layer 106 are disposed in the stated order, down to up along the Z-axis direction.

Over the organic light-emitting layers 106 and top surfaces of the first banks 104, an intermediate layer 107, an electron transport layer 108, a cathode 109, and a sealing layer 110 are disposed in the stated order.

A resin layer 114 is disposed over the sealing layer 110 in the Z-axis direction. Further, a color filter (hereinafter, CF) panel is adhered on top of the resin layer 114. The CF panel is made up of a substrate 111, and color filter layers 112 and black matrix layers 113 disposed on the Z-axis-direction bottom surface of the substrate 111. The resin layer 114 is in close contact with the sealing layer 110, the color filter layers 112, and the black matrix layers 113.

Further, FIG. 3 illustrates that organic light-emitting layers 106 of different light-emission colors may have different thicknesses. Specifically, the present Embodiment is based on an example where the organic light-emitting layer 106 in sub-pixel 10a has a thickness $T_{106a}$, the organic light-emitting layer 106 in sub-pixel 10b has a thickness $T_{106b}$, and the organic light-emitting layer 106 in sub-pixel 10c has a thickness $T_{106c}$. However, no such limitation is intended.

3. Arrangement of First Banks 104 and Second Banks 115

In addition to the first banks 104, the display panel 10 includes second banks 115. The following describes the arrangement of the first banks 104 and the second banks 115 with reference to FIGS. 4A-4C.

Figure 4A:
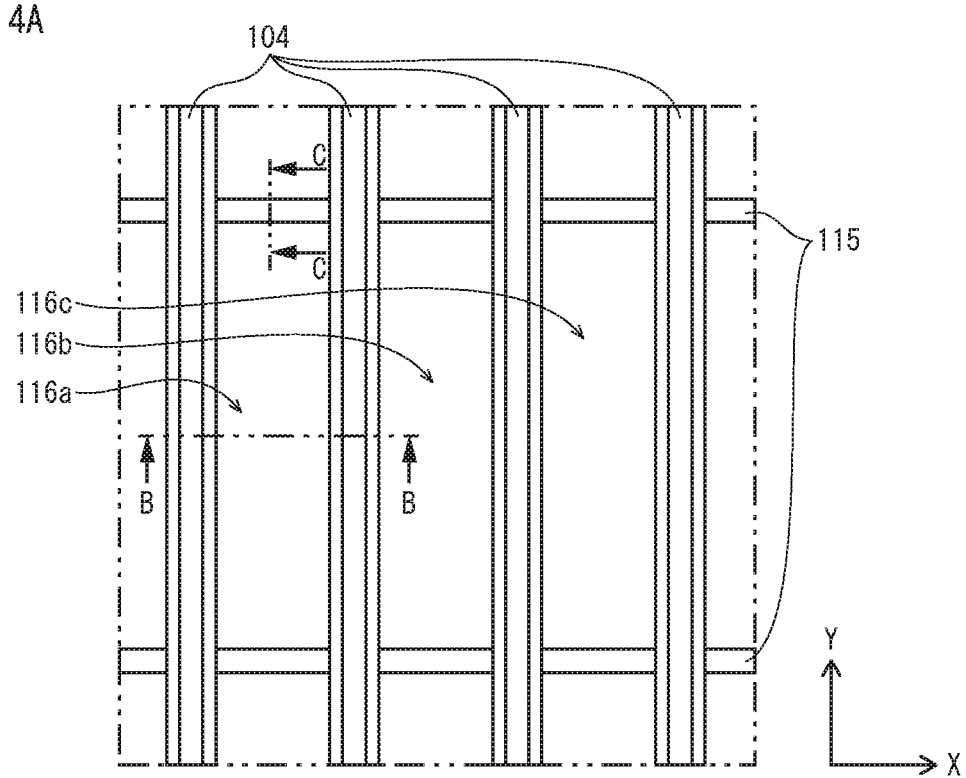
FIG. 4A is a schematic plan view diagram illustrating the arrangement of first banks 104 and second banks 115 in the display panel 10.

As illustrated in FIG. 4A, the first banks 104 are linear banks extending in the Y-axis direction and spaced away from one another in the X-axis direction. Further, as illustrated in FIG. 4A, the second banks 115 are linear banks extending in the X-axis direction and spaced away from one another in the Y-axis direction. This means that the display panel 10 includes a so-called line bank structure in the present Embodiment.

A combination of a pair of adjacent first banks 104 and a pair of adjacent second banks 115 defines one sub-pixel formation region (being either a sub-pixel formation region 116a, a sub-pixel formation region 116b, or a sub-pixel formation region 116c).

Figure 4B:
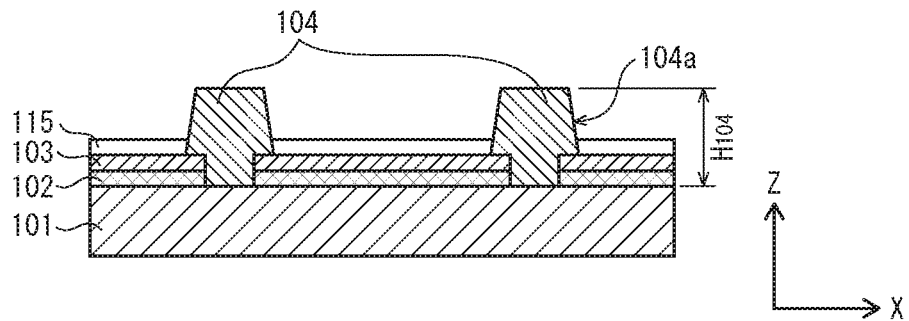
FIG. 4B is a schematic cross-sectional diagram illustrating a partial configuration along a cross-section B-B of FIG. 4A.

As illustrated in FIG. 4B, each first bank 104 is disposed between a pair of sub-pixels (composed of two among a sub-pixel 10a, a sub-pixel 10b, and a sub-pixel 10c) that are adjacent in the X-axis direction. Each first bank 104 has a height $H_{104}$ from the top surface of the electrically-insulative layer 101.

Figure 4C:
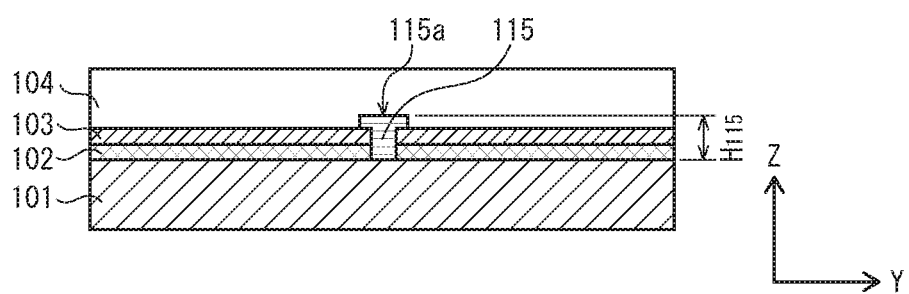
FIG. 4C is a schematic cross-sectional diagram illustrating a partial configuration along a cross-section C-C of FIG. 4A.

Meanwhile, as illustrated in FIG. 4C, each second banks 115 is disposed between adjacent ones of the anode 102 in the Y-axis direction and between adjacent ones of the hole injection layer 103 in the Y-axis direction. Each second bank 115 has a height $H_{115}$ from the top surface of the electrically-insulative layer 101. Specifically, the height $H_{115}$ of the second banks 115 is 40% to 70% the height $H_{104}$ of the first banks 104. More precisely, the height $H_{115}$ of the second banks 115 is 50% to 55% the height $H_{104}$ of the first banks 104.

Further, surface portions 115a of the second banks 115 have lower liquid repellency than lateral surface portions 104a of the first banks 104. Specifically, the liquid repellency of each of such bank surface portions is defined in terms of liquid repellency with respect to inks used for forming the hole transport layers 105 and the organic light-emitting layers 106.

4. Materials of Components of Display Panel 10

(1) TFT Substrate 100

The TFT substrate 100 is made up of a substrate and TFT layers, which are disposed on the Z-axis-direction top surface of the substrate. While the TFT layers are not illustrated in the drawings, each TFT layer includes three types of electrodes, namely the gate, source, and drain electrodes, a semiconductor layer, and a passivation layer.

The substrate serving as the base for the TFT substrate 100 may be formed by using, for example, a glass substrate, a quartz substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate.

When implementing the substrate by using a plastic substrate, the resin of the plastic substrate may either be thermoplastic resin or thermosetting resin. Examples of such resins include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly(4-methylpentene-1), ionomers, acrylic-based resins, polymethyl methacrylater acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be composed of two or more layers of one of such materials or two or more of such materials.

(2) Electrically-Insulative Layer 101

The electrically-insulative layer 101 is, for example, formed by using an organic compound such as polyimide resin, polyamide resin, or acrylic resin. Here, the electrically-insulative layer 101 is beneficially resistant to organic solvents.

Further, in the manufacturing process of the display panel 10, processing such as etching and baking may be performed with respect to the electrically-insulative layer 101. Taking this into account, the electrically-insulative layer 101 is beneficially formed by using a material having high resistance with respect to such processing and thus does not undergo excessive deformation, deterioration, and the like in such processing.

(3) Anodes 102

The anodes 102 are formed by using a metal material containing silver (Ag) or aluminum (Al). In the display panel 10, which is top-emission-type panel, the anodes 102 beneficially have high optical reflectivity at surface portions thereof.

The anodes 102 need not be composed of a single layer formed by using the above-described metal material. For example, the anodes 102 may be composed of a combination of a metal layer and a transparent, electrically-conductive layer. In this case, the transparent, electrically-conductive layer may be formed by using, for example, indium tin oxide (ITO) or indium zinc oxide (IZO).

(4) Hole Injection Layers 103

The hole injection layers 103 are formed by using an oxide of a material such as silver (Ag), molybdenum (Mo), chromium (Cr), vanadium (V), tungsten (W), nickel (Ni), or iridium (Ir), or an electrically-conductive polymer material such as polyethylenedioxythiophene (PEDOT; mixture of polythiophene and polystyrene sulfonic acid).

The hole injection layers 103, when formed by using a metal oxide among the materials described above, has a greater work function compared to the hole injection layers 103, when formed by using an electrically-conductive polymer material such as PEDOT, and has functions of assisting the generation of holes and stably injecting holes to the organic light-emitting layers 108.

Further, the hole injection layers 103, when formed by using an oxide of a transition metal, have multiple energy levels due to oxides of transition metals having multiple oxidation states. This results in the hole injection layers 103 readily performing hole injection and thus achieving a reduction in driving voltage. In particular, forming the hole injection layers 103 by using tungsten oxide ($WO_x$) is beneficial, in order to provide the hole injection layers 103 with the functions of stable hole injection and hole generation assistance.

(5) First Banks 104

The first banks 104 are formed by using an organic material such as a resin, and have an electrically-insulative property. Examples of organic materials usable for forming the first banks 104 include acrylic resin, a polyimide resin, and a novolac type phenolic resin. Further, surfaces of the first banks 104 may be treated with fluorine, in which case the surfaces of the first banks 104 are provided with water repellency.

Further, the first banks 104 need not be composed of a single layer as illustrated in FIGS. 3 and 4B, and instead may be composed of two or more layers. When configuring the first banks 104 to have such a multi-layer structure, the layers may each contain a combination of the materials described above, or the layers may include one or more layers containing inorganic material and one or more layers containing organic material.

(6) Second Banks 115

The second banks 115 are formed, for example, by using an electrically-insulative inorganic material such as silicon oxide ($SiO_2$), silicon nitride (SiN), or silicon oxynitride (SiON), or an electrically-insulative organic material.

Specific examples of electrically-insulative organic materials include acrylic resin, polyimide resin, siloxane resin, and phenol resin.

(7) Hole Transport Layers 105

The hole transport layers 105 are formed by using a high molecular compound without any hydrophilic groups. For example, the hole transport layers 105 may be formed by using a high molecular compound, such as polyfluorene or a derivative thereof or polyarylamine or a derivative thereof, without any hydrophilic groups.

(8) Organic Light-Emitting Layers 106

The organic light-emitting layers 106 are put in excitation state when holes and electrons are injected and recombine therein, and emit light in this excitation state. The organic light-emitting layers 106 are beneficially formed by using an organic material which has a light-emitting property and a film of which can be formed through wet printing.

For example, the organic light-emitting layers 106 are beneficially formed by using one of the fluorescent materials disclosed in Japanese Patent Application Publication No. H05-163488, which include: an oxinoid compound; a perylene compound; a coumarin compound; an azacoumarin compound; an oxazole compound; an oxadiazole compound; a perinone compound; a pyrrolo-pyrrole compound; a naphthalene compound; an anthracene compound; a fluorene compound; a fluoranthene compound; a tetracene compound; a pyrene compound; a coronene compound; a quinolone compound; an azaquinolone compound; a pyrazoline derivative and a pyrazolone derivative; a rhodamine compound; a chrysene compound; a phenanthrene compound; a cyclopentadiene compound; a stilbene compound; a diphenylquinone compound; a styryl compound; a butadiene compound; a dicyanomethylene pyran compound; a dicyanomethylene thiopyran compound; a fluorescein compound; a pyrylium compound; a thiapyrylium compound; a selenapyrylium compound; a telluropyrylium compound; an aromatic aldadiene compound; an oligophenylene compound; a thioxanthene compound; a cyanine compound; an acridine compound; a metal complex of an 8-hydroxyquinoline compound; a metal complex of a 2-bipyridine compound; a complex of a Schiff base and a group III metal; a metal complex of oxine; and rare earth metal complex.

(9) Intermediate Layer 107

The intermediate layer 107 contains a fluoride of an alkali metal or a fluoride of an alkaline earth metal. In the present Embodiment, for example, the intermediate layer 107 is formed by using sodium fluoride (NaF).

(10) Electron Transport Layer 108

The electron transport layer 108 has the function of transporting electrons injected from the cathode 118 to the organic light-emitting layers 106. The electron transport layer 108 is formed, for example, by using an organic material doped with an alkali metal or an organic material doped with an alkaline earth metal. The present Embodiment describes an example where the electron transport layer 108 is formed by using a it electron low-molecular organic material, such as an oxidiazole derivative (OXD), a triazole derivative (TAZ), or a phenanthroline derivative (BCP, Bphen), doped with barium (Ba).

Other than barium, examples of metals usable as the doping metal in the electron transport layer 108 include low-work-function metals such as lithium (Li), calcium (Ca), cesium (Ce), sodium (Na), and rubidium (Rb), salts of low-work-function metals such as lithium fluoride, oxides of low-work-function metals such as barium oxide, organic complexes of low-work-function metals such as lithium quinolinol.

Further, the concentration of the doping metal is, for example, beneficially within a range of from 5 wt % to 40 wt %.

(11) Cathode 109

The cathode 109 is, for example, formed by using ITO or IZO. In the display panel 10, which is top-emission-type panel, the cathode 109 beneficially is formed by using a material having optical transmissivity. Further, the material used for forming the cathode 109 beneficially has an optical transmittance of 80% or higher.

(10) Sealing Layer 110

The sealing layer 110 prevents organic layers such as the organic light-emitting layers 106 from being exposed to moisture, ambient air, etc. For example, the sealing layer 110 is formed by using a material such as SiN (silicon nitride) or SiON (silicon oxynitride). Further, the sealing layer 110 may include, in addition to a layer formed by using SiN or SiON, a sealing resin layer formed by using a resin material such as acrylic resin or silicone resin.

In the display panel 10, which is top-emission-type panel, the sealing layer 110 beneficially is formed by using a material having optical transmissivity.

(12) Substrate 111

Similarly to the substrate 100 described above, the substrate 111 may be formed by using, for example, a glass substrate, a quartz substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate. When a plastic substrate is used for the substrate 111, the plastic resin may be formed by using either thermoplastic resin or thermosetting resin.

(13) Color Filter Layers 112

The color filter layers 112 of each of the colors are red (R), green (G), and blue (B) are formed by using a conventional material selectively allowing visible light with a wavelength of the corresponding color to pass through. For example, the color filter layers 112 may be formed by using acrylic resin as a base material.

(14) Black Matrix Layers 113

The black matrix layers 113 are, for example, formed by using an ultraviolet curing resin material containing black pigment that absorbs light excellently and achieves an excellent light blocking effect. Specifically, one specific example of such ultraviolet curing resin material is acrylic resin.

(15) Resin Layer 114

The resin layer 114 is formed by using a transparent resin material such as an epoxy resin material. Alternatively, the resin layer 114 may be formed by using silicone resin or the like.

5. Surface Shapes of Organic Light-Emitting Layer 106 and Hole Transport Layer 105

Figure 5A:
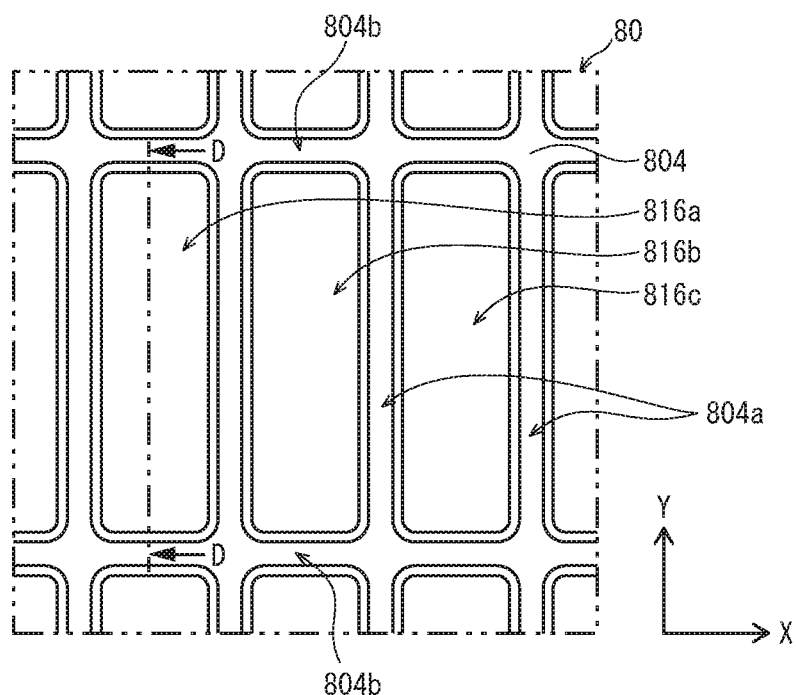
FIG. 5A is a schematic plan view diagram illustrating the configuration of a bank 804 in a display panel 80 pertaining to a comparative example.
Figure 5B:
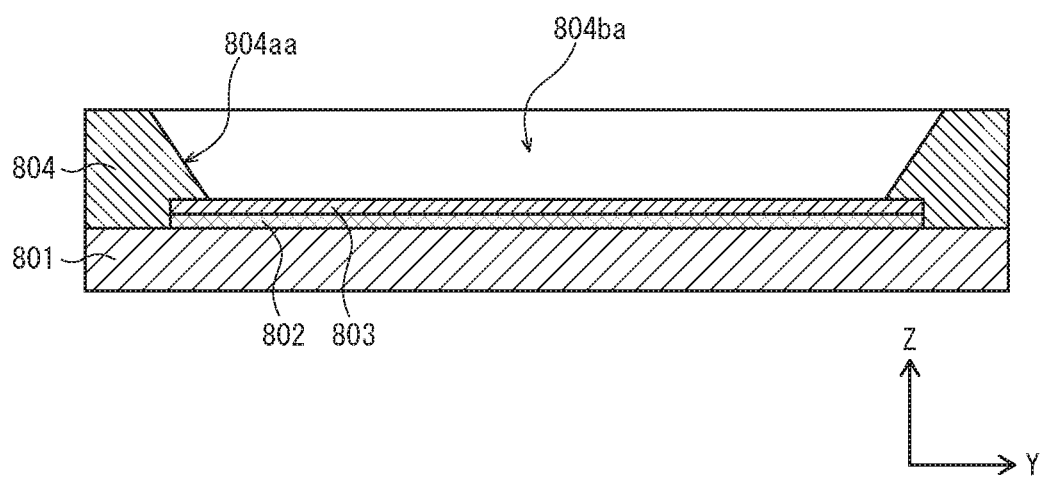
FIG. 5B is a schematic cross-sectional diagram illustrating a partial configuration along a cross-section D-D of FIG. 5A.

FIGS. 5A and 5B, as well as FIG. 6, indicate results of measurements performed regarding surface shapes of the organic light-emitting layer 106 and the hole transport layer 105.

Implementation Example

The display panel 10 pertaining to Embodiment 1, which has been described above and is illustrated in FIG. 3, etc., is used as an implementation example. Note that the measurement of surface shape was performed with respect to the sub-pixel 10a, in which the organic light-emitting layer 106 has the greatest thickness $T_{106a}$, among the sub-pixels 10a through 10c.

Note that the X-direction size of the sub-pixel 10a is 65 μm and the Y-direction size of the sub-pixel 10a is 250 μm.

In addition, the first banks 104 and the second banks 115 are formed so that the heights $H_{104}$ and $H_{115}$ respectively illustrated in FIGS. 4B and 4C satisfied $H_{115}/H_{104}$=54%.

Further, the first banks 104 are formed so that the lateral surface portions 104a of the first banks 104 have a contact angle between 45° and 60° (with respect to anisole), and the second banks 115 are formed so that the lateral surface portions 115a of the second banks 115 have a contact angle of 5° of smaller (with respect to anisole).

Comparative Example

FIG. 5A illustrates a display panel 80 pertaining to a comparative example used in the measurement. The display panel 80 has a pixel bank structure. Specifically, the display panel 80 includes a bank 804 composed of first bank components 804a extending in the Y-axis direction and second bank components 804b extending in the X-axis direction. The first bank components 804a and the second bank components 804b are formed integrally. Further, the bank 804 defines concave portions, each of which being either a sub-pixel formation region 816a, a sub-pixel formation region 816b, or a sub-pixel formation region 816c.

Further, as illustrated in FIG. 5B, in the display panel 80 pertaining to the comparative example, the height of the top surface of the bank 804 remains the same across the entire display region. Also, the bank 804 has lateral surface portions 804aa and 804ba that face apertures. The lateral surface portions 804aa and 804ba have the same level of liquid repellency.

FIG. 5B illustrates only an insulating layer 801, an anode 802, a hole injection layer 803, and the bank 804 among components of the display panel 80. Note that with the exception of the bank 804, the comparative example includes the same components as the implementation example.

Also, sub-pixel size in plan view remains the same between the comparative example and the implementation example.

(Surface Shape)

FIG. 6 is a graph illustrating Y-axis direction surface shapes of the hole injection layers (HIL) and the organic light-emitting layers (EML) in the implementation example and the comparative example, after application and drying.

In FIG. 6, the dashed lines represent the comparative example, and the solid lines represent the implementation example.

<HTL>

As illustrated in FIG. 6, the hole transport layer (HTL) 105 pertaining to the implementation example has a substantially flat surface shape between both ends of the sub-pixel in the Y-axis direction.

Meanwhile, the hole transport layer (HTL) pertaining to the comparative example has a portion of reduced flatness at each end in the Y-axis direction (the portions with low flatness indicated by arrows $E_1$ and $E_2$ in FIG. 6). Specifically, the surface of the hole transport layer pertaining to the comparative example rises in the Z-axis direction as approaching the lateral surface portions of the second bank components 804b of the bank 804.

Note that in the implementation example, the lateral surface portions 104a of the first banks 104 have a contact angle between 45° and 60°, and the lateral surface portions 115a of the second banks 115 have a contact angle of 5° of smaller. Providing the lateral surface portions 115a with such a contact angle is beneficial for ensuring flatness of organic layer surface.

<EML>

As illustrated in FIG. 6, the organic light-emitting layer (EML) 106 pertaining to the implementation example also has a substantially flat surface shape between both ends of the sub-pixel in the Y-axis direction.

Meanwhile, the organic light-emitting layer (EML) pertaining to the comparative example has a portion of reduced flatness at each end in the Y-axis direction (the portions with low flatness indicated by arrows $F_1$ and $F_2$ in FIG. 6). Specifically, the surface of the organic light-emitting layer pertaining to the comparative example rises in the Z-axis direction as approaching the lateral surface portions of the second bank components 804b of the bank 804. Further, the rise of the layer surface at ends of the sub-pixel is greater in the organic light-emitting layer than in the hole transport layer.

According to the above, the organic light-emitting layer 106 and the hole transport layer 105 in the implementation example have flatter surface shapes than the respective correspondents in the comparative example. As described above, in the implementation example, the lateral surface portions 115a of the second banks 115 have lower liquid repellency than the lateral surface portions 104a of the first banks 104, and the height $H_{115}$ of the second banks 115 is lower than the height $H_{104}$ of the first banks 104. As such, it can be considered that in the display panel 10 pertaining to the implementation example, the organic light-emitting layer 106 and the hole transport layer 105 each have uniform thickness in the display region.

In the above, measurement is performed of the surface shapes of the organic light-emitting layer 106 and the hole transport layer 105. However, it is expected that similar results would be obtained for any organic layer formed within a region defined by the first banks 104 and the second banks 115.

6. Light Emission Efficiency

The following explains the results of a measurement performed regarding the light emission efficiencies of the display panel 10 pertaining to the implementation example and the display panel 80 pertaining to the comparative example, with reference to FIG. 7. In FIG. 7, the light emission efficiency of the display panel 10 pertaining to the implementation example is indicated by using a relative value with respect to the value "1.00", which indicates the light emission efficiency of the display panel 80 pertaining to the comparative example.

FIG. 7 illustrates that the light emission efficiency of the display panel 10 pertaining to the implementation example is higher than the light emission efficiency of the display panel 80 pertaining to the comparative example by 29%. As already discussed above, an assumption is made that this improvement in light emission efficiency is achieved by the relationship between the lateral surface portions 104a of the first banks 104 and the surface portions 115a of the second banks 115 in the display panel 10, and the relationship between height the $H_{104}$ of the first banks 104 and the height $H_{115}$ of the second banks 115 in the display panel 10.

7. Width of Second Banks 115

Figure 8A:
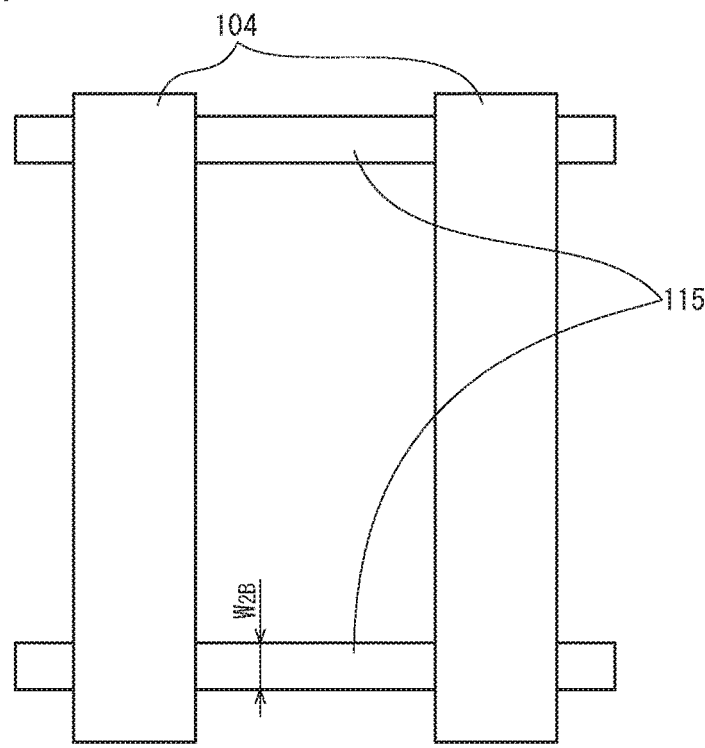
FIG. 8A is a schematic plan view diagram illustrating the arrangement of the first banks 104 and the second banks 115 pertaining to the implementation example.
Figure 8B:
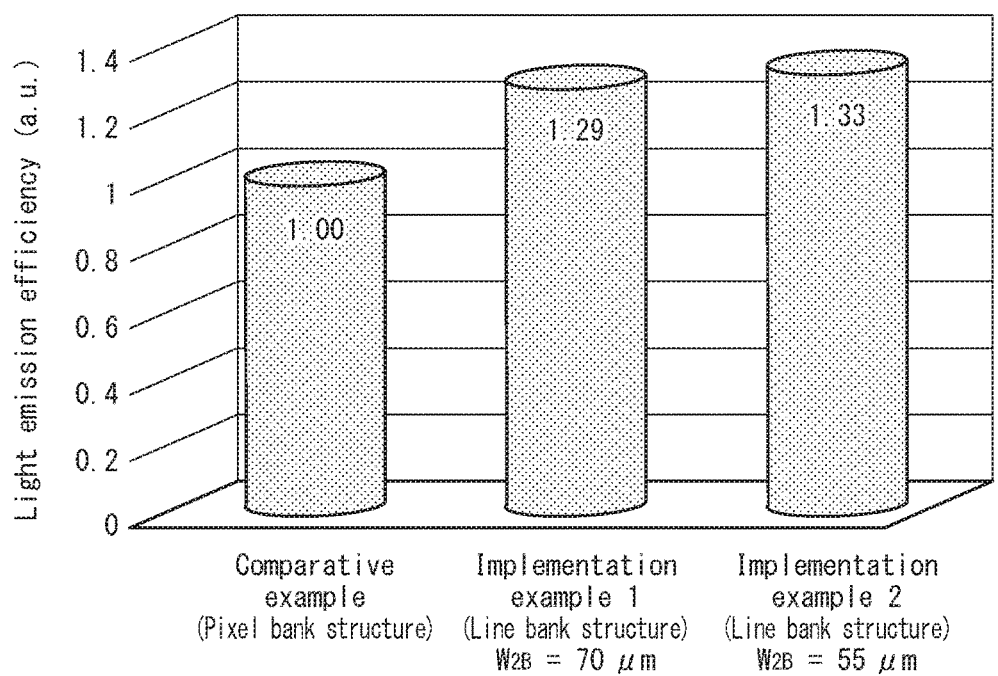
FIG. 8B is a diagram indicating the relationship between width of the second banks 115 and light emission efficiency.

The following describes the relationship between a width of the second banks 115 and light emission efficiency, with reference to FIGS. 8A and 8B.

Each second bank 115 has a width $W_{2B}$ as illustrated in FIG. 8A. Measurement was performed of light emission efficiencies of two display panels in which the width $W_{2B}$ was provided with different values. FIG. 8B illustrates the results of this measurement, in proportion relative to the light emission efficiency of the comparative example described above.

Implementation Example 1

Implementation example 1 is a display panel having the same structure as the display panel 1. In implementation example 1, the width $W_{2B}$ of each second bank 115 is 70 μm. Further, in implementation example 1, the sub-pixels 10a, 10b, and 10c have the same size as in the above, i.e., 65 μm×250 μm. As such, in the implementation example 1, the ratio of the width $W_{2B}$ to the longitudinal-direction size of the sub-pixels 10a, 10b, and 10c is approximately 28%.

Implementation Example 2

Implementation example 2 is a display panel having the same structure as the display panel 1. In implementation example 2, the width $W_{2B}$ of each second bank 115 is 55 μm. Further, in implementation example 2, the sub-pixels 10a, 10b, and 10c have the same size as in the above, i.e., 65 μm×250 μm. As such, in the implementation example 2, the ratio of the width $W_{2B}$ to the longitudinal-direction size of the sub-pixels 10a, 10b, and 10c is approximately 22%.

Comparative Example

As described above, the comparative example is a display panel having the pixel bank structure. Other than this, the comparative example has the same structure as implementation examples 1 and 2. Further, in the comparative example, lateral surface portions of the banks have the same level of liquid repellency at all areas as already discussed above.

(Light Emission Efficiency)

FIG. 8B illustrates that the light emission efficiency of the display panel of implementation example 1 is higher than the light emission efficiency of the display panel of the comparative example by 29%.

FIG. 8B also illustrates that the light emission efficiency of the display panel of implementation example 2, in which the width $W_{2B}$ is smaller than in the display panel of implementation example 1, is higher than the light emission efficiency of the display panel of the comparative example by 33%.

According to the above, the ratio of the width $W_{2B}$ to the longitudinal-direction size of the sub-pixels 10a, 10b, and 10c is beneficially between 20% and 30%, and more beneficially between 20% and 25%. Providing the second banks 115 with such a width $W_{2B}$ is beneficial for achieving high light emission efficiency.

Meanwhile, because the second banks 115 have the function of covering edge portions of anodes 102 and hole injection layers 103, excessively reducing the width $W_{2B}$ is not beneficial for ensuring manufacturing margin.

8. Height of Second Banks 115

Figure 9:
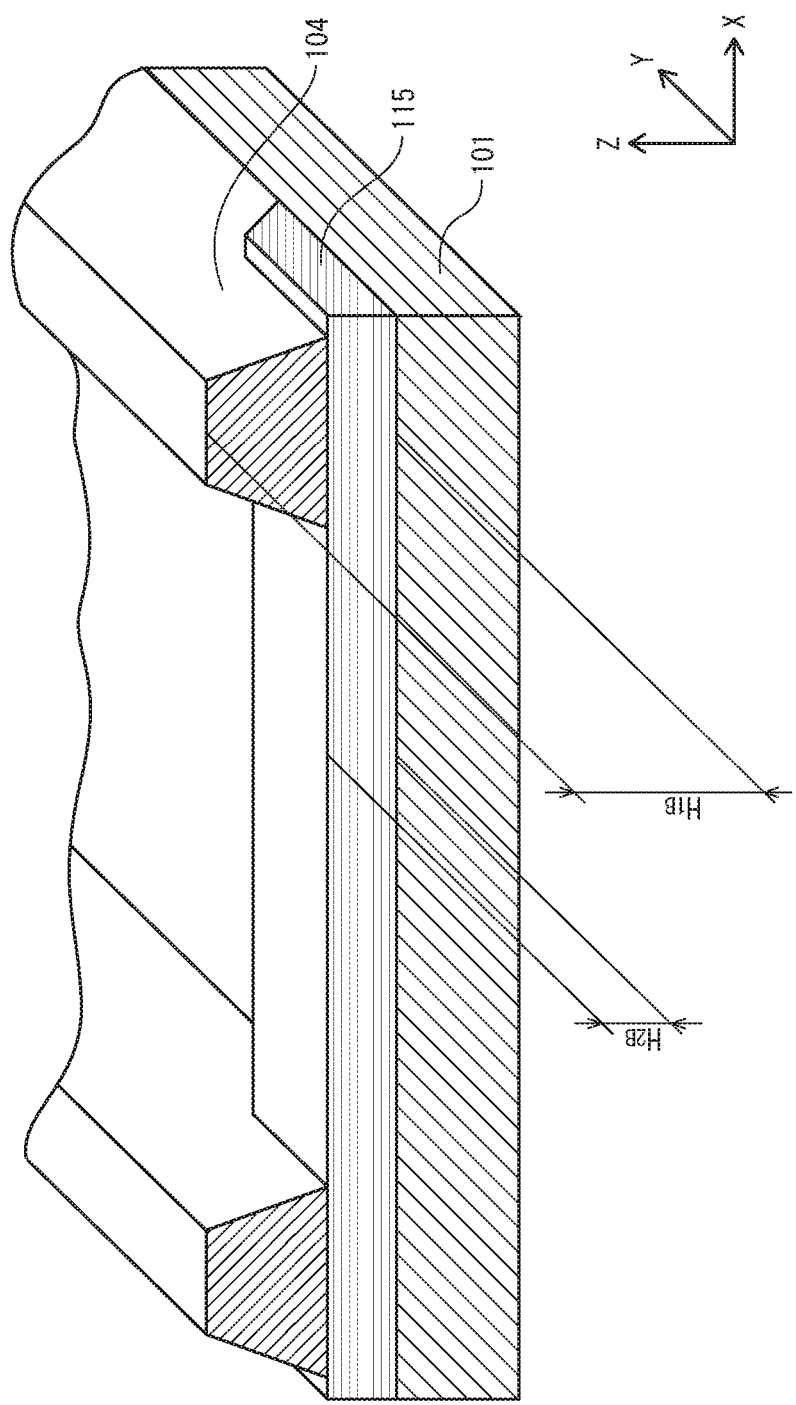
FIG. 9 is a schematic cross-sectional diagram illustrating the configuration of the first banks 104 and the second banks 115.

The following describes the height of the second banks 115, with reference to FIG. 9.

As illustrated in FIG. 9, each second bank 115 in the display panel 10 is formed over the electrically-insulative layer 101 and extends in the X-axis direction, and each first bank 104 in the display panel 10 extends in the Y-axis direction, covering a portion of each second bank 115. Note that in the present Embodiment, when defining $H_{1B}$ as the height of the top surface of each first bank 104 from the Z-axis-direction top surface of the electrically-insulative layer 101 and defining $H_{2B}$ as the height of the Z-axis-direction top surface of each second bank 115 from the Z-axis-direction top surface of the electrically-insulative layer 101, $H_{1B}$ and $H_{2B}$ satisfy $H_{2B}/H_{1B} \approx 54\%$.

However, $H_{1B}$ and $H_{2B}$ not necessarily satisfy this relationship. For example, $H_{1B}$ and $H_{2B}$ may satisfy $H_{1B}=H_{2B}$. $H_{1B}=H_{2B}$ means that, other than at intersections between the first banks 104 and the second banks 115, the height $H_{2B}$ of each second bank 115 is approximately 100% the height $H_{1B}$ of each first bank 104.

However, in a display panel employing the line bank structure, such as the display panel 10 pertaining to the present Embodiment, setting the height ratio $H_{2B}/H_{1B}$ to be between 40% to 70% is beneficial for ensuring flatness of organic layer surface.

Embodiment 2

Figure 10:
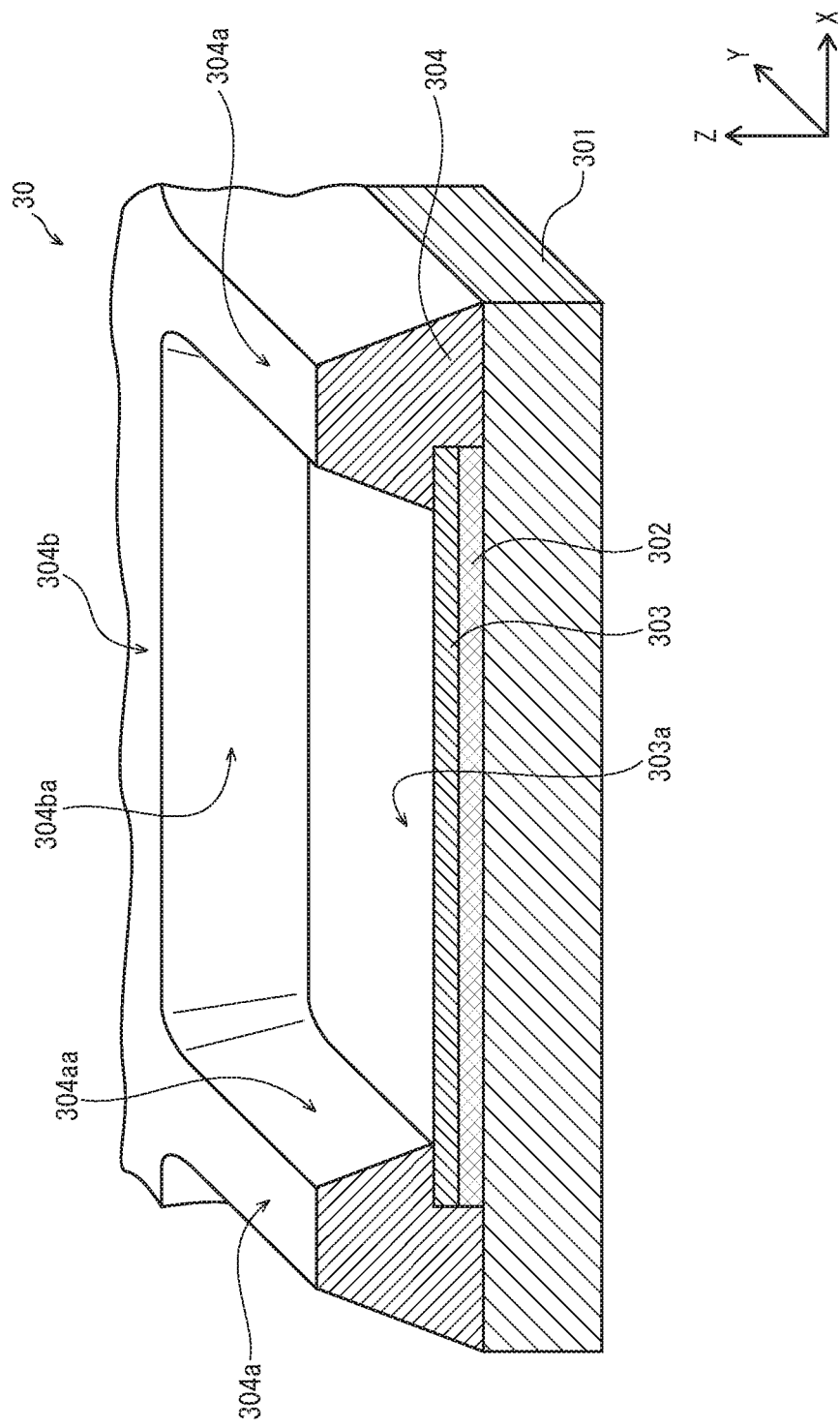
FIG. 10 is a schematic cross-sectional diagram illustrating the configuration of a bank 304 in a display panel 30 pertaining to Embodiment 2 of the present invention.

The configuration of an organic EL display device pertaining to Embodiment 2 of the present invention is described with reference to FIG. 10. FIG. 10 mainly depicts a bank 304 of a display panel 30 included in the organic EL display device pertaining to Embodiment 2. The configuration of the organic EL display device pertaining to Embodiment 2 is similar to the configuration of the organic EL display device 1 pertaining to Embodiment 1, other than the bank 304.

FIG. 10 illustrates that, similar to the display panel 10 in Embodiment 1, the display panel 30 pertaining to the present Embodiment includes an anode 302 and a hole injection layer 303 disposed in the stated order over a Z-axis-direction top surface of an insulating layer 301. The pair of the anode 302 and the hole injection layer 303 is formed for each sub-pixel.

The bank 304 is disposed to cover a portion (an exposed portion) of the Z-axis-direction top surface of the insulating layer 301 and edge portions of a Z-axis-direction top surface of the hole injection layer 303. The bank 304 includes first bank components 304a extending in the Y-axis direction and second bank components 304b extending in the X-axis direction. The first bank components 304a and the second bank components 304b are formed integrally.

The first bank components 304a and the second bank components 304b of the bank 304 are formed by using the same bank material, and the Z-axis-direction top surfaces of the first bank components 304a are flush with the Z-axis-direction top surfaces of the second bank components 304b.

Meanwhile, the liquid repellency of lateral surface portions 304ba of the second bank components 304b is set so as to be lower than the liquid repellency of lateral surface portions 304aa of the first bank components 304a. Specifically, the lateral surface portions 304ba of the first bank components 304a have a contact angle between 45° and 60°, and the lateral surface portions 304ba of the second bank components 304b have a contact angle of 5° of smaller.

Further, the present Embodiment is similar to Embodiment 1 in that the liquid repellency of each of such bank surfaces portions (i.e., the lateral surface portions 304ba of the second bank components 304b and the lateral surface portions 304aa of the first bank components 304a) is defined in terms of liquid repellency with respect to organic layers (specifically organic light-emitting layers) formed through application within apertures surrounded by the bank 304.

Also, the lateral surface portions 304ba of the second bank components 304b and the lateral surface portions 304aa of the first bank components 304a have higher liquid repellency with respect to the above-described ink than an exposed surface 303a of the hole injection layer 303, whose surfaces are liquid-philic.

Further, the display panel 30 pertaining to the present Embodiment employs the pixel bank structure. However, the relationship between the liquid repellency of the lateral surface portions 304aa of the first bank components 304a and the liquid repellency of the lateral surface portions 304ba of the second bank components 304b is defined as described above. Due to this, the present Embodiment, similar to Embodiment 1, ensures that organic layer surfaces, in particular surfaces of organic light-emitting layers, have high flatness. Accordingly, the present Embodiment achieves high light emission efficiency.

Furthermore, similar to Embodiment 1, the present Embodiment provides a configuration where an intermediate layer is disposed between an organic light-emitting layer and an electron transport layer. Due to this, undesirable substances are effectively prevented from penetrating into the electron transport layer. Thus, similar to the display 10 pertaining to Embodiment 1, the display panel 30 pertaining to the present Embodiment remains highly stable while being stored unused, and thus maintains high electron injection characteristics for preventing the electron transport layer from undergoing degradation.

Modification 1

The configuration of a display panel 40 pertaining to Modification 1 is described with reference to FIG. 11A. FIG. 11A schematically illustrates only the configuration of layers in a light emitter of the display panel 40.

In Modification 1, an organic light-emitting layer 406 is disposed between an anode 402 and a cathode 409, as illustrated in FIG. 11A. Further, between the anode 402 and the organic light-emitting layer 406, a hole injection layer 403 and a hole transport layer 405 are disposed in the stated order, with the hole injection layer 403 closer to the anode 402.

Further, between the organic light-emitting layer 406 and the cathode 409, an intermediate layer 407 and an electron transport layer 408 are disposed in the state order, with the intermediate layer 407 closer to the organic light-emitting layer 406.

Embodiment 1 describes an example where the intermediate layer 107 is formed by using NaF. However, in the present Modification, the intermediate layer 407 is formed by using a fluoride of an alkali metal other than Na, or a fluoride of an alkaline earth metal. To provide a specific example, the intermediate layer 407 is formed by using a fluoride of Li.

Similar to the display 10 pertaining to Embodiment 1, the display panel 40 pertaining to the present Modification includes the intermediate layer 407. The intermediate layer 407 is disposed between the organic light-emitting layer 406 and the electron transport layer 408, and is formed by using a fluoride of Li, which is a metal having a low work function and achieving high electron injection characteristics. Thus, similar to the display 10 pertaining to Embodiment 1, the display panel 40 pertaining to the present Modification remains highly stable while being stored unused, and thus maintains high electron injection characteristics for preventing the electron transport layer from undergoing degradation.

Modification 2

The configuration of a display panel 50 pertaining to Modification 2 is described with reference to FIG. 11B. FIG. 11B schematically illustrates only the configuration of layers in a light emitter of the display panel 50.

In Modification 2, an organic light-emitting layer 506 is disposed between an anode 502 and a cathode 509, as illustrated in FIG. 11B. Further, between the anode 502 and the organic light-emitting layer 506, a hole injection layer 503 and a hole transport layer 505 are disposed in the stated order, with the hole injection layer 503 closer to the anode 502. This configuration is similar to those in Embodiment 1 and Modification 1.

Further, in Modification 2, between the organic light-emitting layer 506 and the cathode 509, three layers, namely an intermediate layer 507, a second intermediate layer 517, and an electron transport layer 508 are disposed in the state order, with the intermediate layer 507 closest to the organic light-emitting layer 506.

Similar to the intermediate layers in Embodiment 1 and Modification 1, the intermediate layer 507 is formed by using a fluoride of an alkali metal or a fluoride of an alkaline earth metal. For example, the intermediate layer 507 is formed by using a fluoride of sodium.

Meanwhile, the second intermediate layer 517 is formed by using a metal that has the function of breaking up the bond between the fluoride and the metal (i.e., an alkali metal or an alkaline earth metal) in the intermediate layer 507. Specifically, the second intermediate layer 517 is formed by using an alkali metal or an alkaline earth metal. More specifically, the second intermediate layer 517 is formed by using barium (Ba), for example.

The display panel 50 pertaining to Modification 2, having the above-described configuration, achieves the following effects in addition to the effects that are achieved by the display panels 10, 30, and 40 respectively described in Embodiment 1, Embodiment 2, and Modification 1.

The metal fluoride (a fluoride of an alkali metal or a fluoride of an alkaline earth metal, one example of which being NaF) in the intermediate layer 507 achieves excellent electrical insulation. This may interfere with electron injection characteristics from the electron transport layer 508 to the organic light-emitting layer 506. However, by disposing the second intermediate layer 517, which is formed by using an alkali metal or an alkaline earth metal, between the intermediate layer 507 and the electron transport layer 508, the bond between the fluoride and the metal in the intermediate layer 507 can be broken up. This results in the metal in the intermediate layer 507 (i.e., an alkali metal or an alkaline earth metal) being released, and high electron injection characteristics from the electron transport layer 508 to the organic light-emitting layer 506 being maintained.

Note that when making the present Modification, the thickness of the second intermediate layer 517 is beneficially between 3% and 25% the thickness of the intermediate layer 507. Further, the intermediate later 507 beneficially has a thickness between 1 nm and 10 nm, and the second intermediate later 517 beneficially has a thickness between 0.1 nm and 1 nm.

Further, the metal used as the dopant for the electron transport layer 508 is beneficially the same as the metal used for forming the second intermediate layer 517. The use of the same metal for these purposes facilitates manufacturing. In particular, the same metal used for these purposes is beneficially barium, because barium is a versatile metal and thus the use of barium reduces cost.

Other Matters

Embodiment 1, Embodiment 2, Modification 1, and Modification 2 respectively describe display panels 10, 30, 40, and 50, which are organic EL display panels, as examples of organic light-emitting devices. However, the present invention is not only applicable to organic light-emitting devices. That is, for example, the present invention is also applicable to organic EL lighting devices to achieve the same effects as those described above.

The display panels 10, 30, 40, and 50, which are respectively described in Embodiment 1, Embodiment 2, Modification 1, and Modification 2, are active-matrix-type display panels. However, the present invention is not only applicable to active-matrix-type panels. That is, for example, the present invention may is also applicable to passive-matrix-type display panels.

In Embodiment 1, etc., each pixel is composed of a combination of the three sub-pixels 10a, 10b, and 10c, each having a rectangular shape as seen in plan view, as illustrated for example in FIG. 2. However, the present invention is not only applicable to such a structure. For example, each sub-pixel may have, in plan view, a triangular shape, a hexagonal shape, an octagonal shape, or the like. Further, the sub-pixels, when seen as a whole, may form a honeycomb structure. When making such a modification, the first banks may meander with L-shaped portions in plan view. Further, each pixel may be composed of four or more sub-pixels. When making such a modification, each of the sub-pixels in a single pixel may emit light of a different light, or alternatively, some of the sub-pixels in a single pixel may emit light of a same color.

Additionally, in FIG. 2 for example, a wiring layer (busbar wiring) connecting to cathodes may be provided between neighboring pixels in the X-axis direction.

In each of Embodiment 1, Embodiment 2, Modification 1, and Modification 2, an intermediate layer (intermediate layer 107, intermediate layer 407, or combination of intermediate layer 507 and second intermediate layer 517) is disposed between an organic light-emitting layer (organic light-emitting layer 106, organic light-emitting layer 406, or organic light-emitting layer 506) and an electron transport layer (electron transport layer 108, electron transport layer 408, or electron transport layer 508). However, the present invention is not only applicable to such a structure. For example, an intermediate layer having a barrier effect may be disposed between the organic light-emitting layer and the electron transport layer. This modification also achieves the effects of preventing undesirable substances from penetrating into the electron transport layer and maintaining high electron injection characteristics.

The intermediate layers 107, 407, and 507 need not be formed by using NaF, and the second intermediate layer 517 need not be formed by using Ba. The intermediate layer may be formed by using other substances as long as the intermediate layer is formed by using a fluoride of an alkali metal or a fluoride of an alkaline earth metal, and the intermediate layer may also contain impurities.

Similarly, the second intermediate layer may be formed by using other substances as long as the second intermediate layer is formed by using an alkali metal or an alkaline earth metal. Meanwhile, the metal (an alkali metal or an alkaline earth metal) used for forming the second intermediate layer is beneficially the same as that used as the dopant of the neighboring electron transport layer (the electron transport layer 108 in Embodiments 1 and 2, the electron transport layer 408 in Modification 1, and the electron transport layer 508 in Modification 2).

For example, in Embodiments 1 and 2, description is provided based on a so-called top-emission-type structure. However, the present invention is also applicable to the bottom-emission-type structure. Further, the relative arrangement of the anode (anode 102, anode 302, anode 402, anode 502) and the cathode (cathode 109, cathode 409, cathode 509) may be the reverse of that described above. Even in this case, the appropriate one of the top-emission-type structure and the bottom-emission-type structure may be selected and used.

INDUSTRIAL APPLICABILITY

The present invention is useful for achieving an organic light-emitting device and an organic display device that have high light emission efficiency.

REFERENCE SIGNS LIST

1 Organic EL display device
10, 30, 40, 50 Display device
10a, 10b, 10c Sub-pixel
20 Drive/control circuit unit
21, 22, 23, 24 Drive circuit
25 Control circuit
100 TFT substrate
101, 301 Electrically-insulative layer
102, 302, 402, 502 Anode
103, 303, 403, 503 Hole injection layer
104 First bank
105, 405, 505 Hole transport layer
106, 406, 506 Organic light-emitting layer
107, 407, 507 Intermediate layer
108, 408, 508 Electron transport layer
109, 409, 509 Cathode
110 Sealing layer
111 Substrate
112 Color filter layer
113 Black matrix layer
114 Resin layer
115 Second bank
116a, 116b, 116c Sub-pixel formation region
304 Bank
304a First bank component
304b Second bank component
517 Second intermediate layer

The invention claimed is:

1. An organic light-emitting device comprising:
a substrate; and
light emitters two-dimensionally disposed along a main surface of the substrate, wherein
the light emitters each include, along a first direction intersecting the main surface of the substrate:
a first electrode disposed on or above the substrate;
an organic light-emitting layer disposed on or above the first electrode;
an intermediate layer disposed on or above the organic light-emitting layer;
a charge transport layer disposed on the intermediate layer; and
a second electrode disposed on or above the charge transport layer,
the intermediate layer contains a fluoride of an alkali metal or a fluoride of an alkaline earth metal,
the charge transport layer contains an organic material doped with an alkali metal or an alkaline earth metal,
the organic light-emitting device further comprises:
first banks partitioning the light emitters from one another along a second direction that is one direction along the main surface of the substrate, and extending in a third direction that is one direction along the main surface of the substrate and that intersects the second direction; and
second banks partitioning the light emitters from one another along the third direction, and extending in the second direction, and
the first banks and the second banks each contain an electrically-insulative material, and surface portions of the first banks facing the light emitters have greater liquid repellency than surface portions of the second banks facing the light emitters.

2. The organic light-emitting device of claim 1, wherein along the first direction, a height of the first banks is greater than a height of the second banks.

3. The organic light-emitting device of claim 2 further comprising
an electrically-insulating layer disposed between the substrate and the first electrode, wherein
the height of the first banks and the height of the second banks are heights from a top surface of the electrically-insulating layer.

4. The organic light-emitting device of claim 2, wherein at intersections of the first banks and the second banks, the first banks are on the second banks.

5. The organic light-emitting device of claim 2, wherein along the first direction, the height of the second bank is 40% to 70% the height of the first banks.

6. The organic light-emitting device of claim 2, wherein $0.20L_P \leq W_{2B} \leq 0.30L_P$ holds true, where
$L_P$ denotes a length along the third direction of each of the light emitters in a plan view of said each of the light emitters from the first direction, and
$W_{2B}$ denotes a width along the third direction of each of the second banks in a plan view of said each of the second banks from the first direction.

7. The organic light-emitting device of claim 2, wherein $0.20L_P \leq W_{2B} \leq 0.25L_P$ holds true, where $L_P$ denotes a length along the third direction of each of the light emitters in a plan view of said each of the light emitters from the first direction, and $W_{2B}$ denotes a width along the third direction of each of the second banks in a plan view of said each of the second banks from the first direction.

8. The organic light-emitting device of claim 1, wherein the first banks and the second banks are formed integrally.

9. The organic light-emitting device of claim 8, wherein along the first direction, a height of the first banks is equal to a height of the second banks.

10. The organic light-emitting device of claim 1, wherein the surface portions of the first banks facing the light emitters have greater liquid repellency than the surface portions of the second banks facing the light emitters, with respect to ink for the organic light-emitting layer.

11. The organic light-emitting device of claim 1, wherein the intermediate layer contains a fluoride of sodium, and the charge transport layer contains an organic material doped with barium.

12. An organic display device comprising:

a display panel; and a control/drive circuit connected to the display panel, wherein the display panel has the structure of the organic light-emitting device of claim 1.

* * * * *